United States Patent
Ohtsuka et al.

(10) Patent No.: US 7,678,597 B2
(45) Date of Patent: Mar. 16, 2010

(54) METHOD OF MANUFACTURING SEMICONDUCTOR DEVICE INCLUDING GALLIUM-NITRIDE SEMICONDUCTOR STRUCTURE AND A PALLADIUM CONTACT

(75) Inventors: Kenichi Ohtsuka, Tokyo (JP); Yoichiro Tarui, Tokyo (JP); Yosuke Suzuki, Tokyo (JP); Katsuomi Shiozawa, Tokyo (JP); Kyozo Kanamoto, Tokyo (JP); Toshiyuki Oishi, Tokyo (JP); Yasunori Tokuda, Tokyo (JP); Tatsuo Omori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/323,634

(22) Filed: Nov. 26, 2008

(65) Prior Publication Data

US 2009/0142871 A1    Jun. 4, 2009

(30) Foreign Application Priority Data

Nov. 29, 2007    (JP)    ............................. 2007-308541

(51) Int. Cl.
H01L 21/00    (2006.01)
H01L 21/28    (2006.01)
H01L 21/3205  (2006.01)

(52) U.S. Cl. ...................... 438/36; 438/39; 438/605
(58) Field of Classification Search ............... 438/36, 438/39, 605; 257/E33.033
See application file for complete search history.

(56) References Cited

U.S. PATENT DOCUMENTS

| 6,057,564 | A   | 5/2000 | Rennie |
| 6,291,840 | B1  | 9/2001 | Uemura et al. |
| 7,368,822 | B2* | 5/2008 | Lee et al. ................... 257/742 |
| 2002/0110945 | A1* | 8/2002 | Kuramata et al. ............. 438/36 |
| 2006/0054937 | A1* | 3/2006 | Lucovsky et al. ........... 257/213 |

FOREIGN PATENT DOCUMENTS

| JP | 10-209493 A1 | 8/1998 |
| JP | 11-054798 A1 | 2/1999 |

* cited by examiner

Primary Examiner—William M. Brewster
(74) Attorney, Agent, or Firm—Leydig, Voit & Mayer, Ltd.

(57) ABSTRACT

A method of manufacturing a semiconductor device provides a semiconductor device with a gallium-nitride-based semiconductor structure that allows long-term stable operation without degradation in device performance. After formation of an insulation film on a surface other than on a ridge surface, an oxygen-containing gas such as $O_2$, $O_3$, NO, $N_2O$, or $NO_2$ is supplied to oxidize a p-type GaN contact layer from the surface and to thereby form an oxide film on the surface of the p-type GaN contact layer. Then, a p-type electrode that establishes contact with the p-type GaN contact layer is formed by evaporation or sputtering on the oxide film and on the insulation film. Heat treatment is subsequently performed at temperatures between 400 and 700° C. in an atmosphere containing a nitrogen-containing gas such as $N_2$ or $NH_3$ or an inert gas such as Ar or He.

7 Claims, 4 Drawing Sheets

F I G . 3
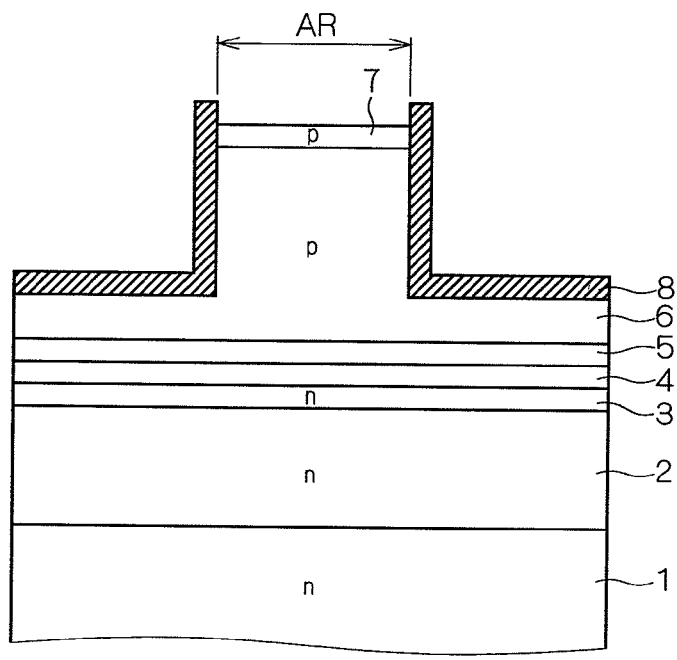
F I G . 4
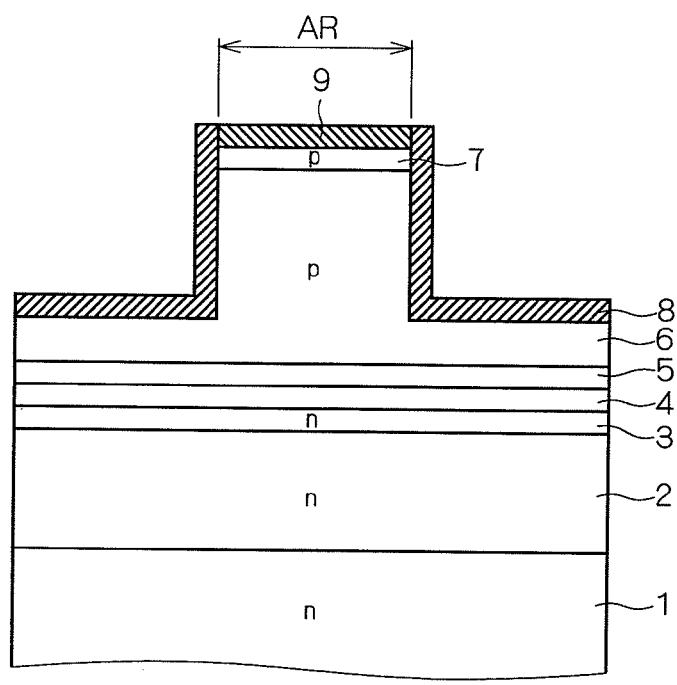

METHOD OF MANUFACTURING SEMICONDUCTOR DEVICE INCLUDING GALLIUM-NITRIDE SEMICONDUCTOR STRUCTURE AND A PALLADIUM CONTACT

BACKGROUND OF THE INVENTION

1. Field of the Invention

The present invention relates to a method of manufacturing a semiconductor device with a gallium-nitride-based semiconductor structure.

2. Description of the Background Art

GaN-, AlGaN-, and InGaN-based semiconductor devices and other wide bandgap semiconductor devices have difficulty in achieving a low-resistance p-type semiconductor layer as compared to achieving an n-type semiconductor layer. It is also difficult for a p-type semiconductor layer to provide low contact resistance for electrode contact with as compared with an n-type semiconductor layer.

Besides, a metal electrode layer formed on a p-type semiconductor layer is often considered insufficient as a layered structure for long-term stable operation. For this reason, Japanese Patent Application Laid-open No. 10-209493, for example, discloses a lamination technique that provides good ohmic properties through the use of palladium (Pd) as a metal electrode layer and through heat treatment in a gas atmosphere containing oxygen. Furthermore, Japanese Patent Application Laid-open No. 11-54798, for example, discloses a technique for reducing a voltage drop through the intervention of a thickness-controlled surface-oxidized film between a GaN semiconductor layer and a metal electrode layer which form a semiconductor electrode layer.

A method of manufacturing such a GaN-based wide bandgap semiconductor device requires either heat treatment in a gas atmosphere containing oxygen at the time of the formation of a metal electrode layer, or the formation of an oxide film on the surface of a p-type GaN semiconductor layer which is to be a semiconductor electrode layer.

If a heat treatment process in a gas atmosphere containing oxygen is necessary in forming a metal electrode layer, metal species that can be used as high-melting-point metals, which are combined with Pd into a layered structure in order to ensure long-term stable operation at current densities as high as or more than 20 kA/cm$^2$, are limited to those metals that are unaffected by oxidation caused by heat treatment in an oxygen atmosphere. This leads to a drawback that a layer-structure metal electrode layer cannot satisfactorily provide long-term stable operation.

The formation of an oxide film on the surface of a p-type GaN semiconductor layer, which is to be a semiconductor electrode layer, is implemented through the process of first removing an initial oxide film on the surface of a p-type semiconductor layer in an HF solution and then controlling the resultant oxide film to a sufficient level by immersion in hot water or oxidation in an oxygen atmosphere. Thus in an actual semiconductor laser element, a structure including an insulation film that is formed to provide a ridge structure for electrical and optical confinement has the problem that the insulation film may be removed, or reduced in thickness, during the process using a HF solution. This will change electrical and optical confinement conditions in a semiconductor laser, thus giving an adverse effect on the laser properties. In other words, there is a problem of degradation in the performance of a GaN-based semiconductor device.

SUMMARY OF THE INVENTION

It is an object of the invention to provide a method of manufacturing a semiconductor device with a gallium-nitride-based semiconductor structure that allows long-term stable operation without degradation in device performance.

A method of manufacturing a semiconductor device according to the invention includes the following steps (a) to (e). The step (a) is to form a gallium-nitride-based semiconductor structure on a substrate. The semiconductor structure includes at least a p-type gallium-nitride contact layer in its uppermost part. The step (b) is to selectively remove an upper part of the semiconductor structure including the contact layer. The semiconductor structure after the step (b) includes a ridge or a mesa that includes the remainder of the contact layer that is not removed, and an other-than-ridge or an other-than-mesa area from which the contact layer is removed. The step (c) is to form an insulation film on a side face of either the ridge or the mesa, and on either the other-than-ridge area or the other-than-mesa area. The step (d) is to form an oxide on a surface of either the ridge or the mesa. The step (e) is to form a metal electrode on an entire surface including on the oxide and on the insulation film. The step (e) includes the following steps (e-1) and (e-2). The step (e-1) is to form the metal electrode of Pd and a high-melting-point metal on the oxide. The step (e-2) is to perform, after the step (e-1), heat treatment using a gas other than oxygen.

In the aforementioned method of manufacturing a semiconductor device, since the heat treatment in the step (e-2) is performed using a gas other than oxygen, it is unnecessary to concern about deterioration of the surface or the interior of the metal electrode caused by oxidation.

As a result, in forming a metal electrode by a combination of Pd and a high-melting-point metal, the high-melting-point metal can be selected from a diverse range of metals, which allows long-term stable operation of the semiconductor device.

Because the high-melting-point metal may be Ta, Cu, W, or the like, the semiconductor device can give long-term stable operation at current densities as high as or more than 20 kA/cm$^2$.

Furthermore, the heat treatment in the step (e-2) will change a structure at the interface via the oxide between the contact layer and the metal, thus establishing a good ohmic contact. In other words, the presence of oxygen can promote the alloying of the contact layer with the metal electrode, thereby providing low contact resistance for ohmic contact.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 6 are cross-sectional views illustrating the method of manufacturing a semiconductor device according to the first preferred embodiment;

DESCRIPTION OF THE PREFERRED EMBODIMENTS

First Preferred Embodiment

FIGS. 1 to 6 are cross-sectional views illustrating a method of manufacturing a GaN-based semiconductor device (semiconductor laser diode) according to a first preferred embodiment of the invention. Referring to these drawings, a manufacturing process in the method of manufacturing a semiconductor device according to the first preferred embodiment is described below.

Figure 1:
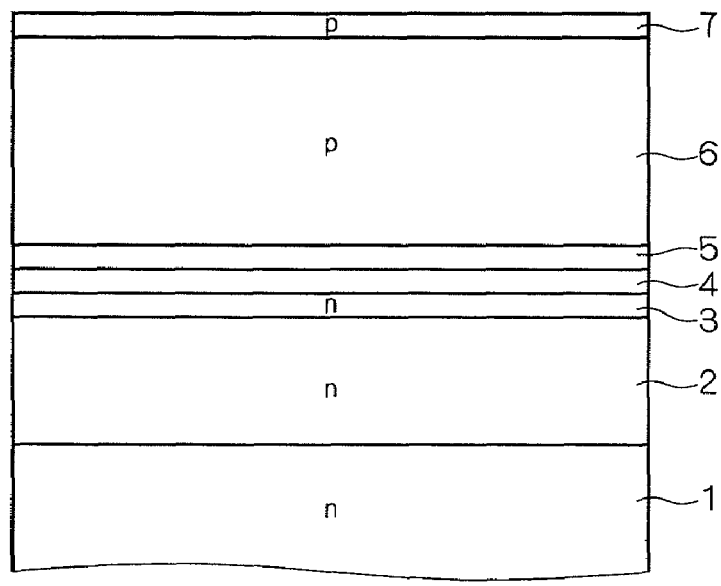
FIG. 1 is a cross-sectional view illustrating a method of manufacturing a semiconductor device according to a first preferred embodiment of the invention.

First, as shown in FIG. 1, a layered structure (semiconductor structure) including an n-type AlGaN cladding layer 2, an n-type GaN guide layer 3, an InGaN quantum-well active layer 4, a GaN guide layer 5, a p-type AlGaN cladding layer 6, and a p-type GaN contact layer 7 is formed on an n-type low-resistance GaN substrate 1.

The n-type AlGaN cladding layer 2 is a layer for carrier and optical confinement, and the n-type GaN guide layer 3 is a layer for light propagation. The n-type GaN guide layer 3 may be replaced with an n-type InGaN guide layer.

The InGaN quantum-well active layer 4 is a light-emitting area, and the GaN guide layer 5 is a layer for light propagation. The GaN guide layer 5 may be replaced with an InGaN guide layer. The p-type AlGaN cladding layer 6 is a layer for carrier and optical confinement. The p-type GaN contact layer 7, which is a contact layer including at least gallium (Ga) and nitrogen (N), is a layer for establishing p-type contact and is formed by epitaxial growth. The p-type GaN contact layer 7 is doped with Mg as an acceptor at concentrations of $1 \times 10^{19}/cm^3$ or more.

Figure 2:
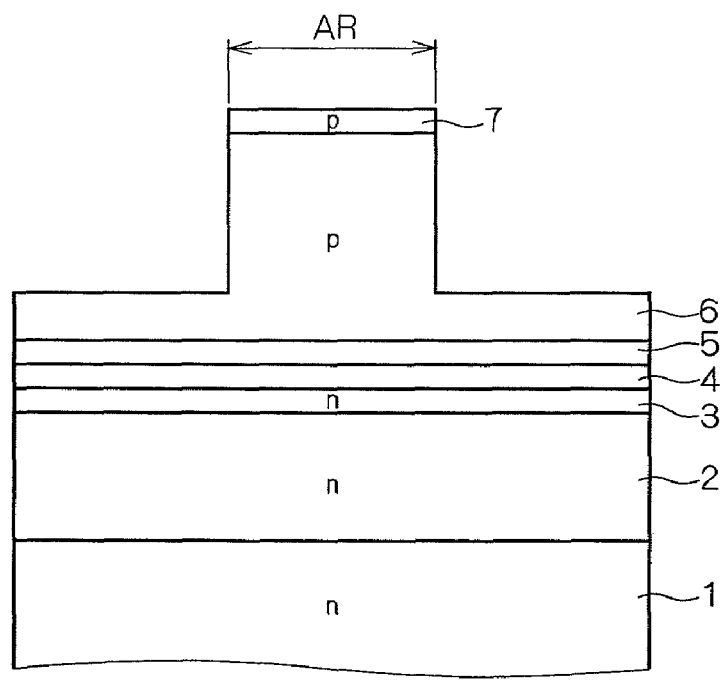

Then, as shown in FIG. 2, after an etching mask is formed in a ridge-forming area AR, the p-type GaN contact layer 7 and most parts of the p-type AlGaN cladding layer 6 are subjected to dry etching. As a result, the ridge-forming area AR has formed therein a projecting ridge stripe including the remainder of the p-type GaN contact layer 7, and an other-than-ridge area (the area other than the ridge-forming area AR) has removed therefrom all the p-type GaN contact layer 7 and part of the p-type AlGaN cladding layer 6. Through the step in FIG. 2 in this way, a ridge structure including a ridge is formed in the ridge-forming area AR.

Then, as shown in FIG. 3, an insulation film 8 is formed on the side face of the ridge and on the other-than-ridge area. At this time, the insulation film 8 on the side face of the ridge is formed projecting a little from the surface of the p-type GaN contact layer 7.

The insulation film 8 is thus not formed on the surface of the ridge (on the surface of the p-type GaN contact layer 7 in the ridge-forming area AR.) Thus, the insulation film 8 is formed on the surface of the p-type AlGaN cladding layer 6 in the other-than-ridge area and on the side face of the p-type GaN contact layer 7.

This insulation film 8 has the functions of passing current to only the ridge and controlling the distribution of light in the ridge by its layer thickness, permittivity, and index of refraction, and it is formed of $SiO_2$ or $SiO_x$ by evaporation or sputtering or by chemical vapor deposition at low temperatures.

Figure 5:
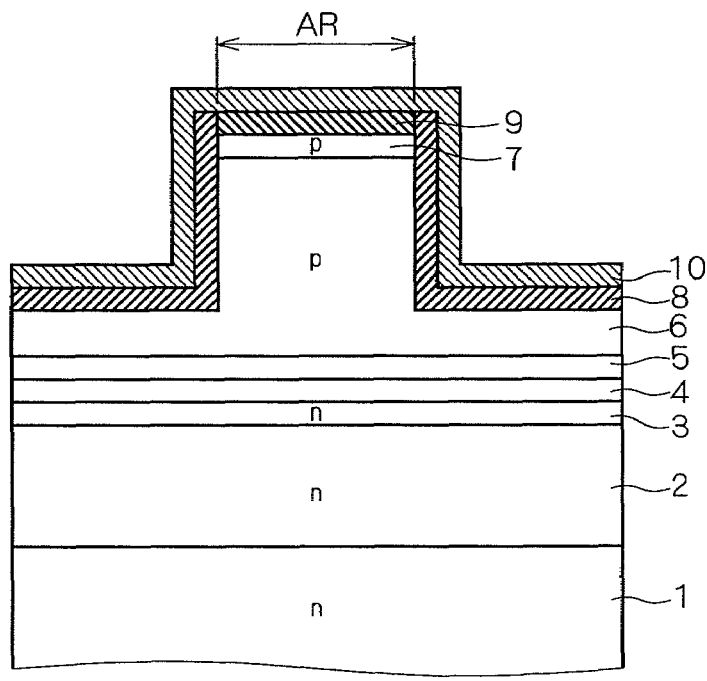

Then, as shown in FIG. 4, an oxide film 9 is formed on the surface of the p-type GaN contact layer 7. After that, as shown in FIG. 5, a p-type electrode 10, which is a metal electrode, is formed on the entire surface including on the oxide film 9 and on the insulation film 8. These steps will be described later in detail.

Figure 6:
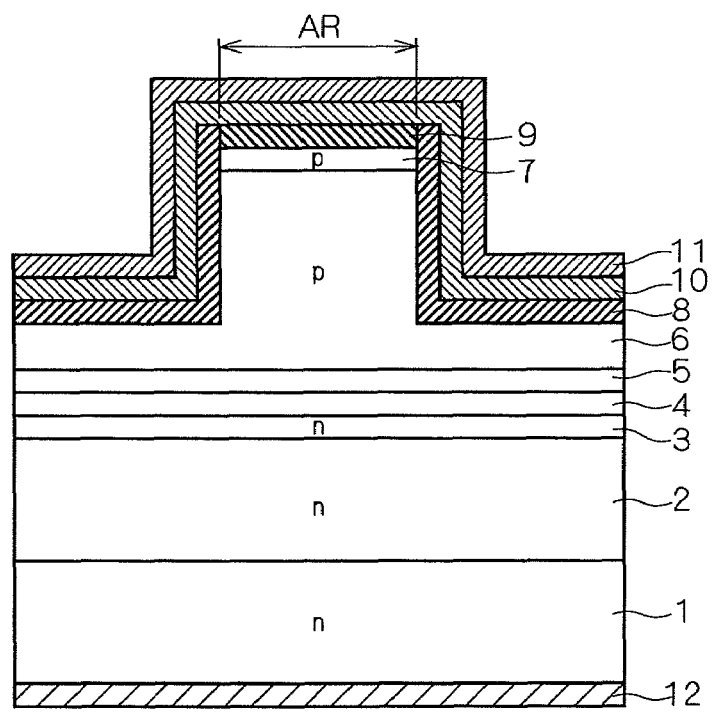

Then, as shown in FIG. 6, a metallized electrode 11 is formed on the p-type electrode 10. The metallized electrode 11 is formed of, for example, titanium (Ti), molybdenum (Mo), Ti, and gold (Au), or of Ti, tantalum (Ta), Ti, and Au, both in order from the semiconductor side. On the underside of the n-type low-resistance GaN substrate 1, on the other hand, an n-type electrode 12 is formed after a reduction in the thickness of the n-type low-resistance GaN substrate 1, which completes the wafer process. The n-type electrode 12 is formed of, for example, Ti, Pt, and Au in order from the semiconductor side.

Although not shown, subsequent steps such as forming a cavity by cleavage, forming an edge-coating film through the formation of a single- or multi-layer dielectric or metal film on cleaved facets with desired reflectivity, forming laser chip and assembling, will complete the manufacture of a GaN-based semiconductor device serving as a semiconductor laser diode.

Now, the step of forming the oxide film 9, corresponding to FIG. 4, is described. After the formation of the insulation film 8 on the surface other than the ridge surface through the step in FIG. 3, an oxygen-containing gas such as $O_2$, $O_3$, NO, $N_2O$, or $NO_2$ is supplied to oxidize the p-type GaN contact layer 7 from the surface and to thereby form the oxide film 9 on the surface of the p-type GaN contact layer 7. The oxide film 9 formed by the oxidation of the p-type GaN contact layer 7 contains Ga, so that it precisely serves as a metallic compound containing oxygen.

The above oxidation can be implemented by either plasma excitation of the above-described oxygen-containing gas, or heating and supply of that gas in a cold-wall furnace. In this case, the presence of an activated species (excited species) of oxygen allows the formation of the oxide film 9 on the surface of the p-type GaN contact layer 7. In addition, through the above plasma excitation or heating and supply, the insulation film 8 has its surface exposed to an activated species of oxygen, thereby improving its denseness as a $SiO_x$ film, and also has its surface exposed to an activated species of nitrogen and nitrided (when a gas such as NO is used), thereby achieving long-term stability of its insulation properties as a $SiO_x$ film.

Thus, the method of manufacturing a semiconductor device according to the first preferred embodiment employs at least any one of $O_2$, $O_3$, NO, $N_2O$, and $NO_2$ as an oxygen-containing gas for use in forming the oxide film 9 in the step in FIG. 4.

The resultant exposure of the surface of the insulation film 8 to an activated species of oxygen can improve the denseness of the insulation film 8. Moreover, when a nitrogen-containing gas is used, the surface of the insulation film 8 is further exposed to an activated species of nitrogen and nitrided, which achieves long-term stability of the insulation properties of the insulation film 8.

As described so far, in the method of manufacturing a semiconductor device according to the first preferred embodiment, the step in FIG. 4 is to supply an oxygen-containing gas or its activated species to the p-type GaN contact layer 7 on the ridge to oxidize the p-type GaN contact layer 7, thereby forming the oxide film 9.

Since, as described above, the processing shown in FIG. 4 does not include wet processing such as that using an HF solution, the insulation film 8 formed on the side face of the ridge and on the other-than-ridge area will never be removed nor reduced in thickness.

Consequently, the method of manufacturing a semiconductor device according to the first preferred embodiment can reliably prevent deterioration in the performance of a semiconductor device due to any change in the insulation-film part of the ridge. In other words, there will be no degradation in electrical and optical confinement in the ridge structure.

The step of forming the p-type electrode 10 in FIG. 5 is implemented as follows. The p-type electrode 10 that establishes contact with the p-type GaN contact layer 7 is formed by evaporation or sputtering on the oxide film 9 and on the insulation film 8. More specifically, the p-type electrode 10 is formed of, for example, Pd and Ta in order from the semiconductor (the p-type GaN contact layer 7) side by evaporation or sputtering. Then, heat treatment is performed at temperatures between 400 and 700° C. in an atmosphere containing a nitrogen-containing gas such as $N_2$ or $NH_3$ or an inert gas such as Ar (argon) or He (helium).

This heat treatment will change a structure at the interface via the oxide film 9 between the p-type GaN contact layer 7 and the p-type electrode 10, thus providing good ohmic contact. In other words, the presence of oxygen promotes the alloying of the p-type GaN contact layer 7 with the p-type electrode 10, thereby providing low contact resistance for ohmic contact.

Furthermore, the heat treatment after the formation of the p-type electrode 10 is performed in a gas containing no oxygen. This consequently eliminates the need to concern about deterioration of the surface or the interior of the metal due to oxidation and allows the use of a high-melting-point metal such as Ta, Cu (copper), or W (tungsten) for a metal combined with Pd, thereby achieving long-term stable operation at current densities as high as or more than 20 kA/cm$^2$. This is because high-melting-point metals such as Ta, Cu, and W are metals that enable long-term stable operation at high current densities if there is no possibility that their surface or interior is deteriorated due to oxidation.

Second Preferred Embodiment

Figure 7:
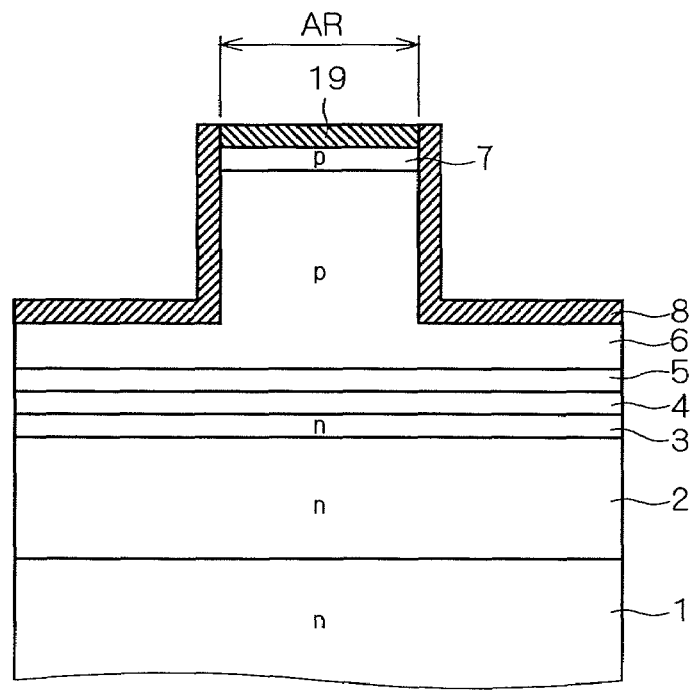
FIG. 7 is a cross-sectional view illustrating part of a method of manufacturing a semiconductor device according to a second preferred embodiment of the invention.

FIG. 7 is a cross-sectional view illustrating part of a method of manufacturing a GaN-based semiconductor device (semiconductor laser diode) according to a second preferred embodiment of the invention. Referring now to FIG. 7, a manufacturing process in the method of manufacturing a semiconductor device according to the second preferred embodiment is described.

After the steps of the first preferred embodiment in FIGS. 1 to 3, then as shown in FIG. 7, a metallic compound 19, which is also an oxide, is formed on the surface of the p-type GaN contact layer 7 by a deposition of a metallic compound that contains oxygen or both oxygen and nitrogen, such as GaO, RuO, PdO, GaON, RuON, or PdON.

Then, through the steps of the first preferred embodiment in FIGS. 5 and 6, the same processing as described in the first preferred embodiment is performed, completing the manufacture of a GaN-based semiconductor device according to the second preferred embodiment. It is noted herein that the oxide film 9 in FIGS. 5 and 6 is replaced with the metallic compound 19.

Since the method of manufacturing a semiconductor device according to second preferred embodiment, as in the first preferred embodiment, employs no wet process such as that using an HF solution in forming the metallic compound 19, there is no deterioration in electrical and optical confinement in the ridge structure due to removal or reduced thickness of the insulation film 8.

Besides, as in the first preferred embodiment, after the formation of the p-type electrode 10, heat treatment is performed at temperatures between 400 and 700° C. in an atmosphere containing a nitrogen-containing gas such as N$_2$ or NH$_3$ or an inert gas such as Ar or He. This will change a structure at the interface between the p-type GaN contact layer 7 and the p-type electrode 10, thus providing good ohmic contact.

In the method of manufacturing a semiconductor device according to the second preferred embodiment, the step in FIG. 7 is to form the metallic compound 19 containing at least a metal and oxygen, on the p-type GaN contact layer 7. At this time, a metallic-compound area similar to the metallic compound 19 is also formed on the insulation film 8. That is, at the formation of the metallic compound 19, a metallic-compound area made of a material that contains oxygen or both oxygen and nitrogen, such as GaO, RuO, PdO, GaON, RuON, or PdON, is also formed on the insulation film 8.

Thus, at the subsequent formation of the p-type electrode 10, the p-type electrode 10 is also formed via the above metallic compound area on the insulation film 8. This has the effect of improving adhesion of the entire p-type electrode 10 to the p-type GaN contact layer 7 and to the insulation film 8, via the metallic compound 19 and the above metallic-compound area.

Using at least any one of GaO, RuO, PdO, GaON, RuON, and PdON for the above metallic-compound area can further improve the above adhesion.

In addition, in the method of manufacturing a semiconductor device according to the second preferred embodiment, the heat treatment after the formation of the p-type electrode 10 is performed in a gas containing no oxygen. This, as in the first preferred embodiment, allows long-term stable operation at current densities as high as or more than 20 kA/cm$^2$.

Third Preferred Embodiment

Figure 8:
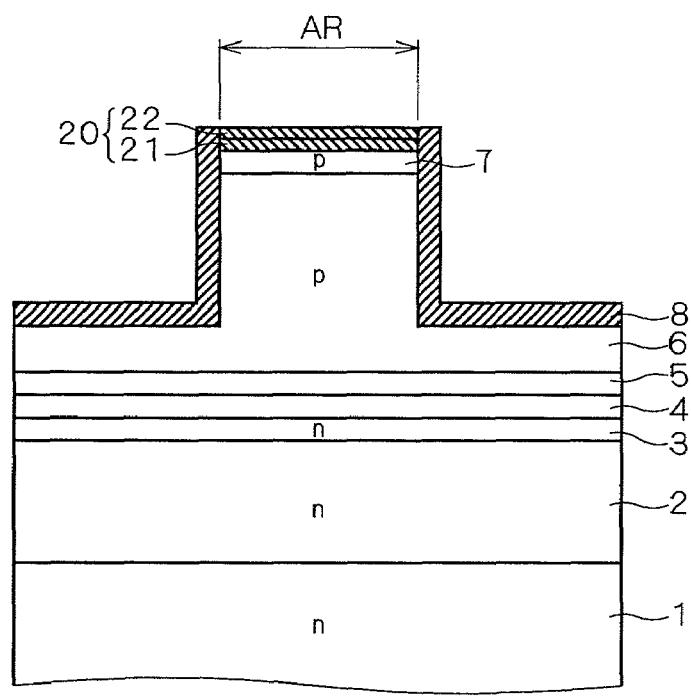
FIG. 8 is a cross-sectional view illustrating part of a method of manufacturing a semiconductor device according to a third preferred embodiment of the invention.

FIG. 8 is a cross-sectional view illustrating part of a method of manufacturing a GaN-based semiconductor device according to a third preferred embodiment of the invention. Referring now to FIG. 8, a manufacturing process in the method of manufacturing a semiconductor device according to the third preferred embodiment is described.

After the steps of the first preferred embodiment in FIGS. 1 to 3, then as shown in FIG. 8, an oxide film 21 is formed on the surface of the p-type GaN contact layer 7 by oxidation of the surface of the p-type GaN contact layer 7 with the supply of an oxygen-containing gas such as O$_2$, O$_3$, NO, N$_2$O, or NO$_2$.

Further, a metallic compound 22 is formed on the oxide film 21 by a deposition of a metallic compound that contains oxygen or both oxygen and nitrogen such as GaO, RuO, PdO, GaON, RuON, or PdON. These oxide film 21 and the metallic compound 22 form a layered oxide structure 20.

After that, through the steps of the first preferred embodiment in FIGS. 5 and 6, the same processing as described in the first preferred embodiment is performed, completing the manufacture of a GaN-based semiconductor device according to the third preferred embodiment. It is noted herein that the oxide film 9 in FIGS. 5 and 6 is replaced with the layered oxide structure 20.

Thus, in the method of manufacturing a semiconductor device according to the third preferred embodiment, as in the first preferred embodiment, through the heat treatment in forming the oxide film 21, the insulation film 8 has its surface exposed to an activated species of oxygen, thereby improving its denseness as an SiO$_x$ film, and also has its surface exposed to an activated species of nitrogen and nitrided, thereby achieving long-term stability of its insulation properties as a SiO$_x$ film.

Further, since the method of manufacturing a semiconductor device according to third preferred embodiment, like those of the first and second preferred embodiments, employs no wet process, such as that using an HF solution, in forming the oxide film 21, there is no deterioration in electrical and optical confinement in the ridge structure due to removal or reduced thickness of the insulation film 8.

Besides, as in the first and second preferred embodiments, after the formation of the p-type electrode 10, heat treatment is performed at temperatures between 400 and 700° C. in an atmosphere containing a nitrogen-containing gas such as N$_2$ or NH$_3$ or an inert gas such as Ar or He. This will change a structure at the interface between the p-type GaN contact layer 7 and the p-type electrode 10, thus providing good ohmic contact.

Furthermore, in the method of manufacturing a semiconductor device according to the third preferred embodiment, as in the second preferred embodiment, the metallic-compound area that contains oxygen or both oxygen and nitrogen, such as GaO, RuO, PdO, GaON, RuON, or PdON, is also deposited on the insulation film 8 at the time of the formation of the metallic compound 22. Thus, at the subsequent formation of the p-type electrode 10 on the entire surface, the p-type electrode 10 is formed via the above metallic compound area on the insulation film 8. This has the effect of improving adhesion of the entire p-type electrode 10 to the p-type GaN contact layer 7 and to the insulation film 8.

In addition, in the method of manufacturing a semiconductor device according to the third preferred embodiment, the heat treatment after the formation of the p-type electrode 10 is performed in a gas containing no oxygen. This, as in the first and second preferred embodiments, allows long-term stable operation at current densities as high as or more than 20 kA/cm$^2$.

Other Preferred Embodiments

While the aforementioned preferred embodiments have discussed the semiconductor laser diodes as examples of a GaN-based semiconductor device and have described the oxide film 9 (the metallic compound 19 or the layered oxide structure 20) formed therein on the p-type GaN contact layer 7, any other element that has contact with a p-type layer can achieve long-term stable operation of a semiconductor device (element) in a similar fashion. Examples other than the semiconductor laser diodes include Zener diodes, and IMPATT (IMpact ionization Avalanche Transit Time) diodes utilizing an avalanche effect.

These elements are configured to have a circular or polygonal mesa, instead of a stripe mesa, that includes the remainder of a contact layer that is not removed, and an other-than-mesa area from which the contact layer is removed, through the step of selectively removing an upper part of a semiconductor structure including the contact layer.

While in the semiconductor lasers described above, a ridge is formed by selective removal to a layer of the same conductivity type as a contact layer, it may be formed by selective removal to a layer of the opposite conductivity type to a contact layer. This also applies to others such as Zener diodes or IMPATT diodes; specifically, a mesa may be formed by selective removal to a layer of either the same conductivity type as or the opposite conductivity type to a contact layer.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising
   (a) forming a gallium-nitride-based semiconductor structure on a substrate, said semiconductor structure including a p-type gallium-nitride contact layer in an uppermost part;
   (b) selectively removing an upper part of said semiconductor structure, including part of said contact layer, said semiconductor structure thereafter including a ridge or a mesa that includes the remainder of said contact layer that has not been removed, and an other-than-ridge or an other-than-mesa area from which said contact layer has been removed;
   (c) forming an insulating film on a side face of either said ridge or said mesa and on either said other-than-ridge area or said other-than-mesa area, but not forming said insulating film on a surface of either said ridge or said mesa that is not a side face of either said ridge or said mesa;
   (d) forming an oxide covering the surface that is not a side face of either said ridge or said mesa; and
   (e) forming a metal electrode completely covering said oxide and said insulating film, wherein forming a metal electrode includes
      (e-1) forming said metal electrode of Pd and a high-melting-point metal on said oxide, and
      (e-2) after forming said metal electrode of Pd and a high-melting point metal on said oxide, performing a heat treatment in a gas other than oxygen.

2. The method of manufacturing a semiconductor device according to claim 1, wherein forming an oxide on a surface includes
   (d-1) supplying an oxygen-containing gas or activated species of an oxygen-containing gas to said contact layer in either said ridge or said mesa and oxidizing said contact layer, thereby forming an oxide film, wherein said oxide includes said oxide film.

3. The method of manufacturing a semiconductor device according to claim 2, wherein forming an oxide includes
   (d-2) forming a metallic compound, including at least a metal and oxygen, on said oxide, wherein said oxide includes a layered oxidized structure including said oxide film and said metallic compound.

4. The method of manufacturing a semiconductor device according to claim 1, wherein forming a metal electrode includes
   (d-1) forming a metallic compounds, including at least a metal and oxygen, on said contact layer, wherein said oxide includes said metallic compound.

5. The method of manufacturing a semiconductor device according to claim 2, wherein said oxygen-containing gas includes at least one gas selected from the group consisting of $O_2$, $O_3$, NO, $N_2O$, and $NO_2$.

6. The method of manufacturing a semiconductor device according to claim 3, wherein said metallic compound includes at least one metallic compound selected from the group consisting of GaO, RuG, PdO, GaON, RuON, and PdON.

7. The method of manufacturing a semiconductor device according to claim 1, wherein said high-melting-point metal includes at least one high-melting-point metal selected from the group consisting of Ta, Cu, and W.

* * * * *